US006328473B1

(12) United States Patent
Tokushima et al.

(10) Patent No.: US 6,328,473 B1
(45) Date of Patent: Dec. 11, 2001

(54) STATIC AIR-BEARING AND STAGE APPARATUS USING THE BEARING AND OPTICAL APPARATUS USING THE STAGE APPARATUS

(75) Inventors: Shinobu Tokushima; Yukiharu Okubo, both of Kawasaki; Toshimasa Shimoda, Ageo, all of (JP)

(73) Assignee: Nikon Corporation, Tokyo (JP)

( * ) Notice: Subject to any disclaimer, the term of this patent is extended or adjusted under 35 U.S.C. 154(b) by 16 days.

(21) Appl. No.: 09/637,605

(22) Filed: Aug. 15, 2000

Related U.S. Application Data (63) Continuation of application No. PCT/JP99/03077, filed on Jun. 9, 1999.

(30) Foreign Application Priority Data

Jun. 17, 1998 (JP) .................................................. 10-169697

(51) Int. Cl.[7] .................................................. F16C 32/06
(52) U.S. Cl. .................................................. 384/12
(58) Field of Search ................................ 384/12, 13, 100

(56) References Cited

U.S. PATENT DOCUMENTS

| 2,449,297 | * | 9/1948 | Hoffer ................................ 384/12 X |
| 4,191,385 |   | 3/1980 | Fox et al. . |
| 4,272,216 | * | 6/1981 | Osburn ................................ 384/12 X |
| 4,425,508 |   | 1/1984 | Lewis, Jr. et al. . |
| 4,653,408 | * | 3/1987 | Nagashima et al. ................ 384/12 X |
| 4,865,465 | * | 9/1989 | Sugita et al. ............................ 384/12 |
| 4,969,169 |   | 11/1990 | Forsyth et al. . |
| 5,218,896 |   | 6/1993 | Furukawa . |
| 5,562,396 | * | 10/1996 | Yamazaki et al. .................. 384/12 X |
| 5,784,925 | * | 7/1998 | Trost et al. ........................ 384/12 X |
| 5,839,324 | * | 11/1998 | Hara .................................. 384/12 X |

FOREIGN PATENT DOCUMENTS

| 58-5523 | 1/1983 | (JP) . |
| 5-30547 | 4/1993 | (JP) . |

* cited by examiner

*Primary Examiner*—Thomas R. Hannon
(74) *Attorney, Agent, or Firm*—Oliff & Berridge PLC (57) ABSTRACT

A static air-bearing provides a gas layer between two relatively movable parts (fixed part and movable part) and a predetermined clearance between the two parts, to a stage apparatus, and to an optical apparatus, and provides a static air-bearing, a stage apparatus, and an optical apparatus each of which can limit its size and can make pipe arrangement easy. The static air-bearing comprising a fixed part 4 and a movable part 3 movably disposed along the fixed part 4 and maintaining a predetermined clearance between the fixed part 4 and the movable part 3 by an air layer between the fixed part 4 and the movable part 3, the movable part 3 having a bearing pad 3a that blows air into the air layer between the fixed part 4 and the movable part 3 and an air exhaust groove 3c that exhausts the air blown out of the bearing pad 3a, and the fixed part 4 having an air exhaust port 4a that is disposed at a position facing the air exhaust groove 3c.

19 Claims, 11 Drawing Sheets

STATIC AIR-BEARING AND STAGE APPARATUS USING THE BEARING AND OPTICAL APPARATUS USING THE STAGE APPARATUS

This application is a continuation application based on PCT/JP99/03077 filed Jun. 9, 1999 designating U.S.A.

BACKGROUND OF THE INVENTION

1. Field of the Invention

The present invention relates to a static air-bearing which provides a gas layer between two relatively movable parts (fixed part and movable part) and a predetermined clearance between the two parts, to a stage apparatus using the air-bearing, and to an optical apparatus using the state apparatus.

2. Description of the Related Art

In the process for producing semiconductor devices, to project a circuitry pattern onto a wafer, a mask or reticle (hereinafter "reticle") forming the circuitry pattern to be projected thereon is used. During the process to manufacture the intended semiconductor wafer, an inspection apparatus is used to inspect whether the circuitry pattern to be projected has been accurately formed on the wafer in accordance with a circuitry design.

The inspection apparatus is designed to be able to inspect the whole surface of the wafer to be inspected by moving the wafer using a stage apparatus. A static air-bearing is used in the stage apparatus accommodated in the inspection apparatus, because high positioning accuracy is required.

Figure 10:
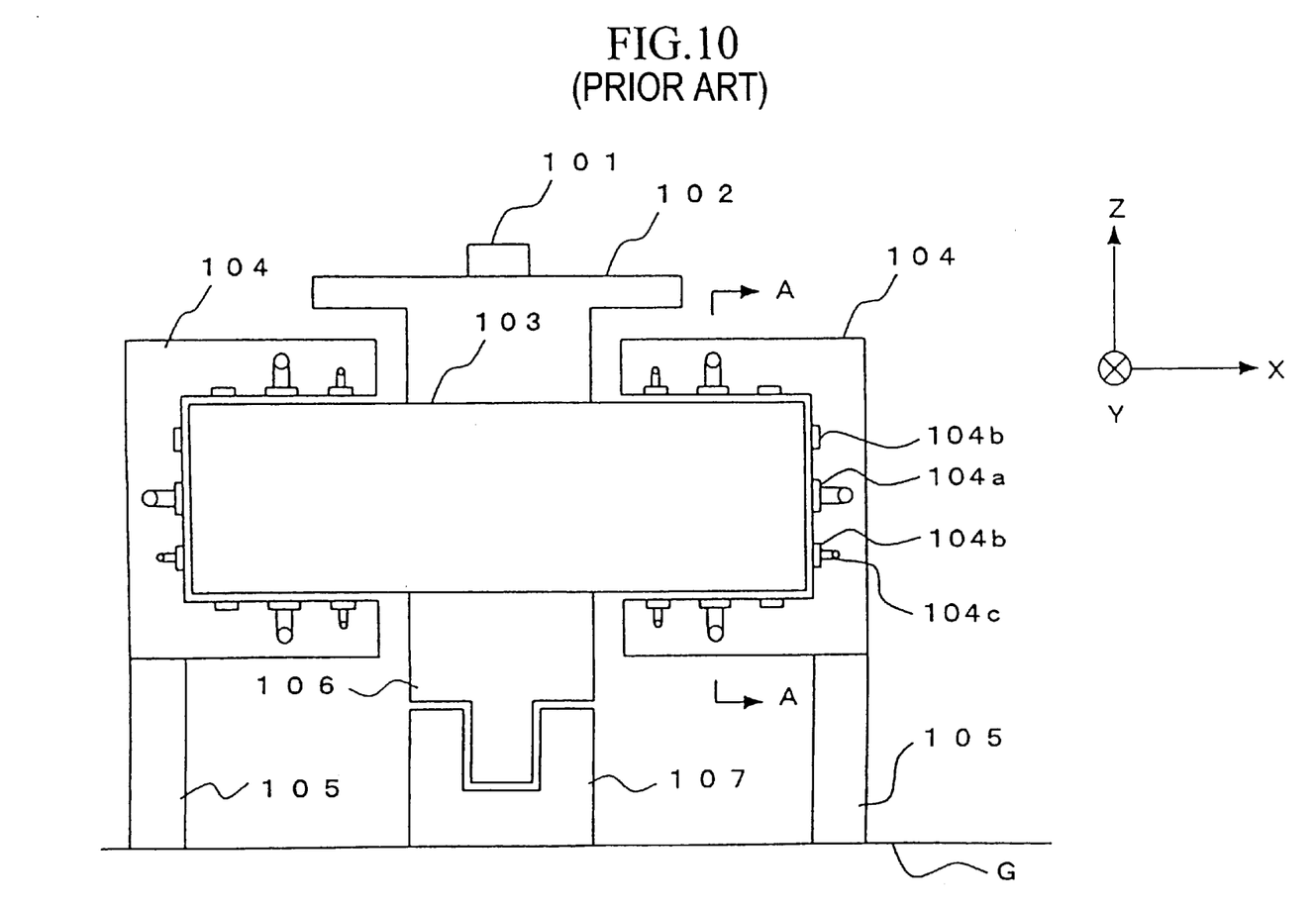
FIG. 10 is a structural view generally showing a conventional stage apparatus.

Referring to FIG. 10, such stage apparatus using a static air-bearing will be explained. FIG. 10 is a sectional view of a stage apparatus. In FIG. 10, an X-axis and a Y-axis, perpendicular to each other, are set in a plane parallel to a installation floor G; and, a Z-axis is set perpendicular to the installation floor G.

This stage apparatus has a stage 102 which mounts a wafer 101 to be inspected on it. The stage 102 is connected to a movable part 103 of a static air-bearing (103, 104). The movable part 103 has a rectangular sectional profile. A fixed part 104 is disposed so that the three surfaces of the −X side end portion of the movable part 103 and of the +X side end portion of the movable part 103 are surrounded by this fixed part 104. Further, the fixed part 104 is fixed on the installation floor G via a fixing part 105.

Bearing pads 104a which blows air from a air supply (not shown) into the space between the fixed part 104 and the movable part 103, are disposed at each surface of the fixed part 104 facing the movable part 103. Further, air exhaust grooves 104b which temporarily store the air blown out of the bearing pads 104a are formed around the bearing pads 104a to exhaust the air; and, air exhaust ports 104c which are connected to a vacuum pump (not shown) are provided with the air exhaust grooves 104b.

In the static air-bearing (103, 104), the air is continuously blown into the space between the movable part 103 and the fixed part 104, and the blown up air is temporarily stored in the air exhaust grooves 104b and then exhausted through the air exhaust ports 104c. Therefore, an air layer of approximately constant pressure is formed in the space between the movable part 103 and the fixed part 104, and the movable part 103 and the fixed part 104 will be kept apart at a predetermined clearance.

A movable piece 106 of a linear motor (106, 107) is connected to the movable part 103, and the movable piece 106 is disposed so that the movable piece 106 faces a stator 107 leaving a space. The linear motor (106, 107) can move the movable piece 106 in the Y-direction along the stator 107.

Figure 11A:
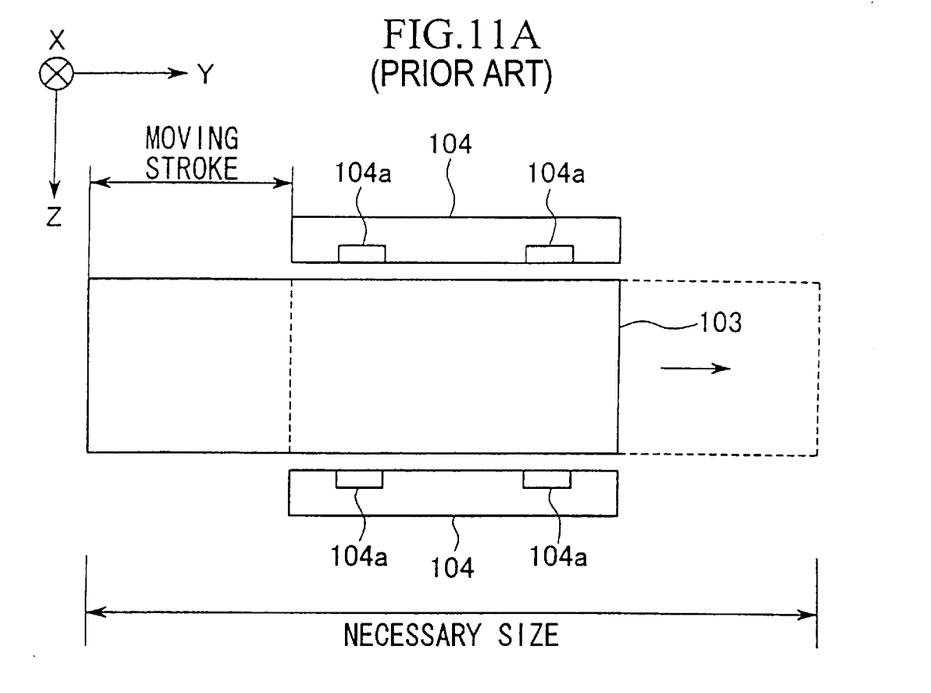
FIG. 11A is a sectional view for explaining a required space for a conventional static air-bearing.

Referring now further to FIG. 11A, the static air-bearing of the stage apparatus will be explained. FIG. 11A is a sectional view of the movable part 103 and the fixed part 104, illustrated in FIG. 10, taken on line A—A in FIG. 10, and is attached with a similar coordinate system.

In this static air-bearing, the length of the movable part 103 must be longer than the length of the fixed part 104 by approximately the moving stroke, because the bearing pads 104a on the fixed part 104 and movable part 103 need to face each other during the movement of the movable part 103. The movable part 103 moves up to the position indicated by the dashed lines in the Figure.

Thus, relative to this static air-bearing, approximately two times the length of the moving stroke over the fixed part 104 is to be secured to satisfy the free movement of the movable part 103 with respect to the Y-direction, which yields a problem that this bearing becomes large sized.

Accordingly, another problem that a stage apparatus which uses this static air-bearing also becomes large sized arises. Also, an inspection device which accommodates this stage apparatus become large sized. Those problems also occur, not only with respect to the inspection device, but also with respect to other optical apparatuses which accommodate similar stage apparatuses, e.g., exposure apparatuses that are used in the lithography process for producing semiconductor or LCD elements, electron microscopes, or electron beam apparatuses that transfer or form circuitry patterns on substrates by irradiating electron beams onto substrates.

Figure 11B:
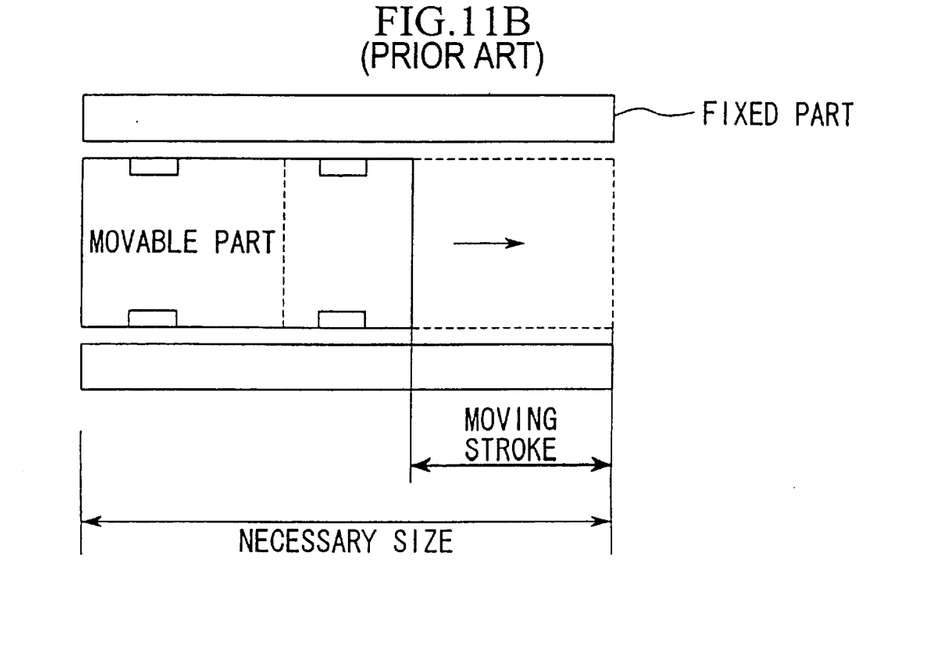
FIG. 11B is a sectional view for explaining a required space for a conventional static air-bearing.

By contrast, in such static air-bearing as shown in FIG. 11B in which bearing pads and air exhaust ports are disposed on a movable part, the movable part needs only to move up to the position indicated by the dashed lines in the FIG. 11B while this air-bearing is configured to realize a similar moving stroke as is realized by the air-bearing shown in the above FIG. 11A. Thus, the adoption of this air-bearing makes the length to be secured with respect to the Y-direction shorter.

However, in the static air-bearing disposing the bearing pads and the air exhaustion ports on the movable part as shown in FIG. 11B, a problem that arrangement of pipes relayed to the air exhaustion ports becomes very difficult arises. That is, the pipes for air exhaustion are generally made of metallic, elastic bellows so that the pipes do not crush due to sucking force caused by air suction by means of a vacuum pump and still follow the movement of the movable part. While a certain force is necessary to give the metallic bellows telescopic motion, it is difficult to give the metallic bellows smooth telescopic motion following the movement of the movable part.

For example, in the configuration in which force being executed on the movable part also gives the bellows the telescopic motion, reaction force from the bellows executes on the movable part, so that a proper clearance between the fixed part and the movable part might not be maintained or accurate movement of the movable part might be influenced.

An object of the present invention is to provide a static air-bearing which can limit its size and can make pipe arrangement easy, a stage apparatus using the air-bearing, and an optical apparatus using the stage apparatus.

SUMMARY OF THE INVENTION

Referring to and associating with FIGS. 1–9 showing embodiments of the present invention, the above object is accomplished by a static air-bearing having a fixed part (4, 32) and a movable part (3, 31) which is movably disposed among the fixed part (4, 32), and providing a predetermined clearance between the fixed part (4, 32) and the movable part (3, 31) with an air layer, the static air-bearing being characterized in that the movable part (3, 31) has an air blow portion (3a) which blows air into the air layer between the fixed part (4, 32) and the movable part and has an air exhaust groove (3c, 11a, 21a, 31a, 31b) which exhausts the air blown out of the air blow portion (3a) and in that the fixed part (4, 32) has an air exhaust port (4a, 32a, 32b) which is disposed at a position facing the air exhaust groove (3c, 11a, 21a, 31a, 31b).

Further, in a static air-bearing embodiment of the present invention, the air exhaust groove (3c, 11a, 21a, 31a, 31b) is characterized in that it is disposed so as to surround the air blow portion (3a). In addition, in a static air-bearing embodiment of the present invention, the air exhaust port (4a, 32a, 32b) is characterized in that it is disposed, with respect to movement direction of the movable part (3, 31), approximately on the center of the surface of the fixed part (4, 32) corresponding to a moving area of the movable part (3, 31). Furthermore, in a static air-bearing embodiment of the present invention, the static air-bearing is characterized in that an air exhaust groove provided on the movable part (31) includes a first air exhaust groove (31a) and a second air exhaust groove (31b), the movable part (31) providing the second air exhaust groove (31b) around the first air exhaust groove (31a) and in that the fixed part (32) has a first air exhaust port (32a) which is disposed at a position facing, over the moving area of the movable part (31), the first air exhaust groove (31a) to suck and exhaust air in the first air exhaust groove (31a); and has a second air exhaust port (32b) which is disposed at a position facing, over the moving area of the movable part (31), the second air exhaust groove (31b) to suck and exhaust air in the second air exhaust groove (31b). Moreover, in a static air-bearing embodiment of the present invention, the static air-bearing is characterized in that the movable part (31) and the fixed part (32) face each other at a plurality of surfaces and in that the air exhaust groove (31a, 31b) is disposed so as to extend over a plurality of surfaces.

Further, the above object is accomplished by a stage apparatus having a static airbearing provided with a movable part (3, 31) movably disposed along a fixed part (4, 32), a stage (2) fixed to the movable part (3, 31), and a stage drive unit (6, 7) that moves the stage (2), the stage apparatus being characterized in that the static air-bearing is a static air-bearing in accordance with the present invention.

Also, the above object is accomplished by an optical apparatus having a stage apparatus (ST, WST) which mounts a specimen to be processed (W) on it and moves, and an irradiation system (41, 51) which irradiates a light beam or a charged particle beam onto the specimen (W) mounted on the stage apparatus (ST, WST), the optical apparatus being characterized in that the stage apparatus (ST, WST) is a stage apparatus in accordance with the present invention.

DETAILED DESCRIPTION OF THE PREFERRED EMBODIMENTS

Figure 1:
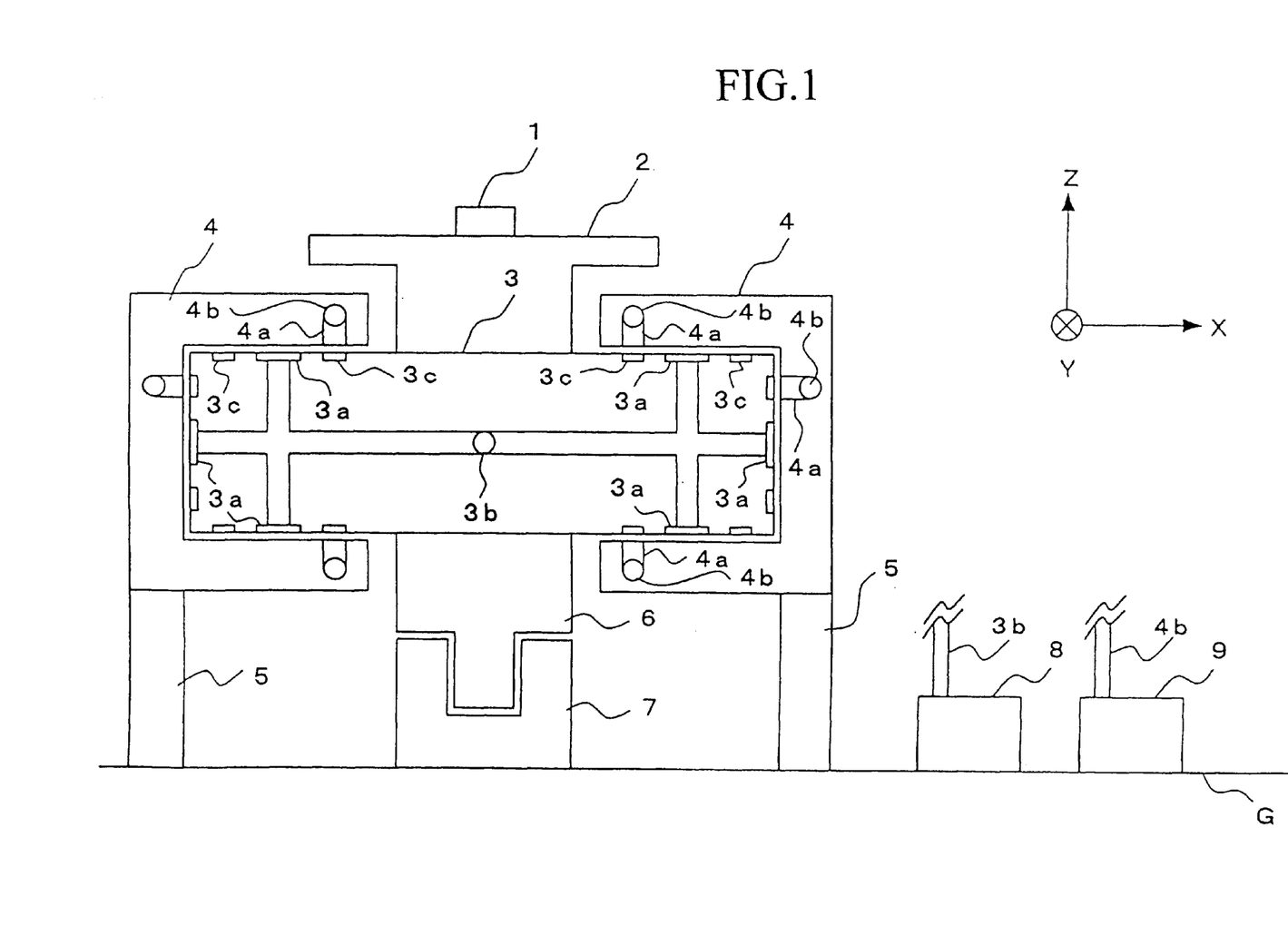
FIG. 1 is a view generally showing a stage apparatus according to an embodiment of the present invention.
Figure 2:
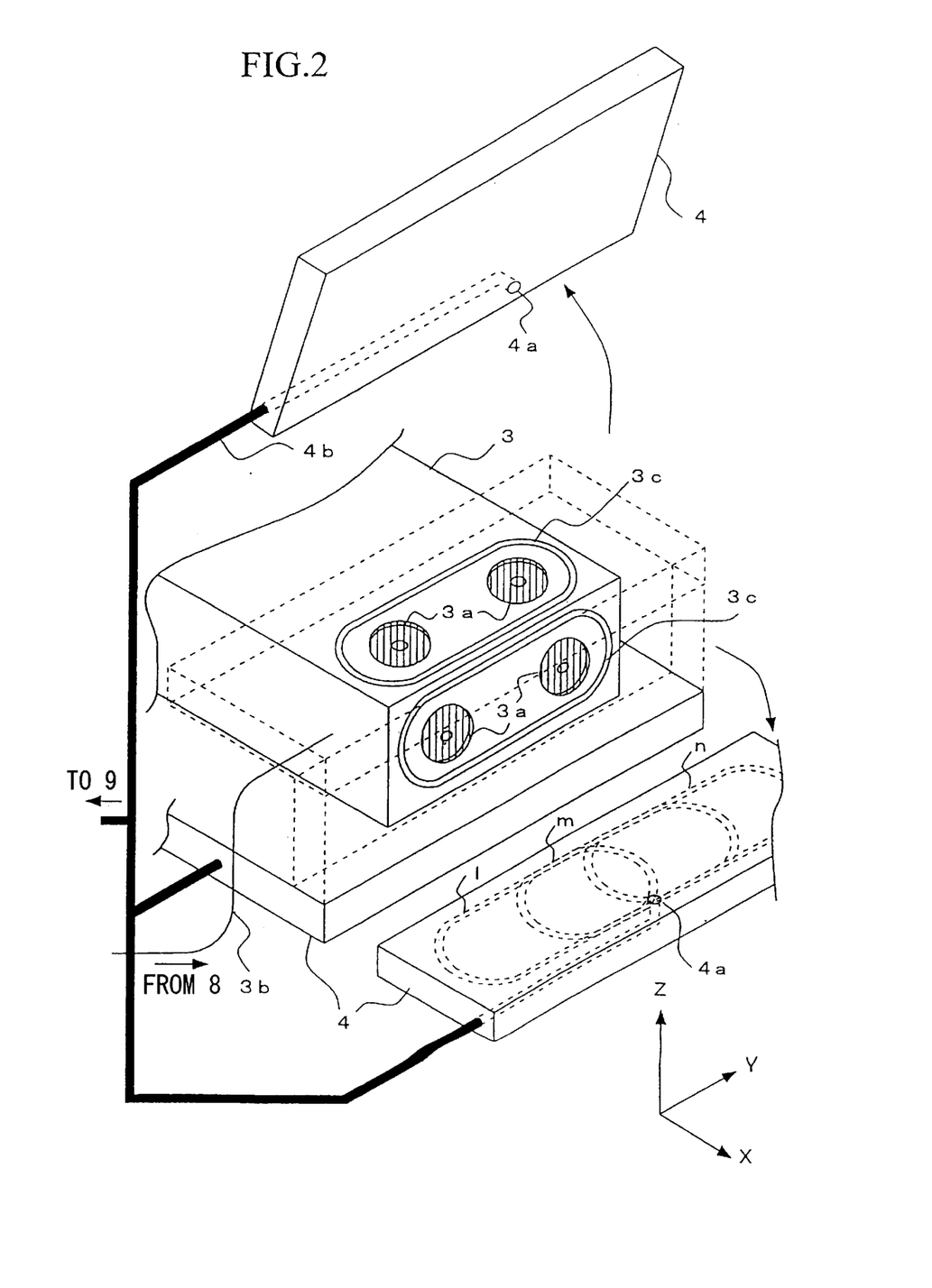
FIG. 2 is a perspective view partially showing a stage apparatus according to an embodiment of the present invention.

Referring to FIGS. 1 and 2, a static air-bearing according to an embodiment of the present invention and a stage apparatus using the same will be explained. First, referring to FIG. 1, general structure of the stage apparatus according to this embodiment will be explained. In FIG. 1, an X-axis and a Y-axis, perpendicular to each other, are set in a plane parallel to an installation floor G; and, a Z-axis is set perpendicular to the installation floor G.

This stage apparatus has a stage 2 on which a wafer 1 to be inspected is mounted. The stage 2 is connected to a movable part 3, whose sectional profile is rectangular, of a static air-bearing (3, 4). Fixed parts 4 are disposed so that they face three surfaces, comprising +X, +Z, and –Z side surfaces, on the +X side end portion of the movable part 3, and three surfaces, comprising –X, +Z, and –Z side surfaces, on the –X side end portion of the movable part 3. Further, the fixed part 4 is fixed on the installation floor G via a fixing part 5.

The movable part 3 and the fixed part 4 will now be explained referring to FIG. 2 in conjunction with FIG. 1. A similar coordinate system to that in FIG. 1 is set in FIG. 2. FIG. 2 is a perspective view showing +X side end portions of the movable part 3 and the fixed part 4, more specifically, showing a state in which the fixed part 4, facing the +X and +Z side surfaces of the movable part 3, is exploded.

On each surface of the movable part 3 facing the fixed part 4 are disposed two bearing pads 3a made of a porous material. The bearing pads 3a are connected to an air supply source 8 which supplies air, via a tube 3b. The tube 3b is made of a lightweight, flexible material (for example, vinyl material) and moves following movement of the movable part 3 without affecting the movement of the movable part 3. Accordingly; arrangement of the tube 3b can be easily realized.

Further, on each surface of the movable part 3 facing the fixed part 4 is disposed an air exhaust groove 3c which is formed from two lines parallel to the Y-axis and two outwardly convex semicircles, and surrounds the two bearing pads 3a on the surface.

As shown in FIG. 2, on each surface of the fixed part 4 facing the movable part 3 is formed an air exhaust port 4a at a position always facing, over the movement range of the movable part 3, the air exhaust groove 3c. Here, the dashed line 1 shown in FIG. 2 illustrates the region, of the fixed part 4, which faces the air exhaust groove 3c when the movable part 3 has moved to the end position with respect to the −Y direction; the dashed line m illustrates the region, of the fixed part 4, which faces the air exhaust groove 3c when the movable part 3 is at the approximate center of the movement range of the movable part 3; and, the dashed line n illustrates the region, of the fixed part 4, which faces the air exhaust groove 3c when the movable part 3 has moved to the end position with respect to the +Y direction.

In this embodiment, the air exhaust port 4a is formed at a position corresponding to the approximate center of the movement range of the movable part 3. While, in this static air-bearing, the air exhaust port 4a and the air exhaust groove 3c need to face each other over the movement range of the movable part 3, the necessary length in the Y direction of the movable part 3 can be limited approximately to the moving stroke, by forming the air exhaust port 4a at the position corresponding to the approximate center of the movement range of the movable part 3, as described above. In this case, while the necessary length in the Y direction of the fixed part 4 is approximately two times the width of the movement range of the movable part, i.e., the moving stroke, the overall necessary length in the Y direction of this static air-bearing can be limited approximately to the length in the Y direction of the fixed part 4, i.e., two times the moving stroke. By this, a similar moving stroke to that of the conventional static air-bearing shown in FIG. 11A which forms bearing pads and air exhaust ports on a fixed part can be realized, while the size being smaller than that of the conventional static air-bearing.

The air exhaust port 4a of the fixed part 4 is connected to a rotary pump 9 via a metallic pipes 4b. The metallic pipes 4b are connected to the fixed part 4 which does not move on the installation floor G, so that there is no need to give consideration to the pipe arrangement.

Referring back to FIG. 1, a movable piece 6 of a linear motor (6, 7) is connected to the center portion of the −Z direction side surface of the movable part 3, and the movable piece 6 is disposed so that the movable piece 6 faces a stator 7 leaving a space. The linear motor (6, 7) is configured so that, through interaction between the movable piece 6 and the stator 7, it can move the movable piece 6 in the Y-direction along the stator 7.

Next, movement of this stage apparatus will be explained.

In this stage apparatus, air is continuously supplied via the tube 3b to the bearing pads 3a of the movable part 3 by the air supply source 8, and said air is blown into the space between the fixed part 4 and the movable part 3. The blown up air passes through the space between the fixed part 4 and the movable part 3, and is temporarily stored in the air exhaust grooves 3c formed so as to surround the bearing pads 3a. Next, the air stored in the air exhaust grooves 3c is exhausted at the air exhaust ports 4a facing the air exhaust grooves 3c by the rotary pump 9 via the exhaust pipes 4b. By this, an air layer of approximately constant pressure is formed between the movable part 3 and the fixed part 4, and the movable part 3 and the fixed part 4 are kept apart at a predetermined clearance (for example, a few microns).

Further, keeping the clearance between the movable part 3 and the fixed part 4, the movement of the stage 2 is done as described below. Namely; the linear motor (6, 7), through the interaction between the movable piece 6 and the stator 7, moves the movable piece 6 in the Y-direction along the stator 7. By this, the movable part 3 connected to the movable piece 6 and the stage 2 connected to the movable pad 3 are moved in the Y-direction.

Figure 3:
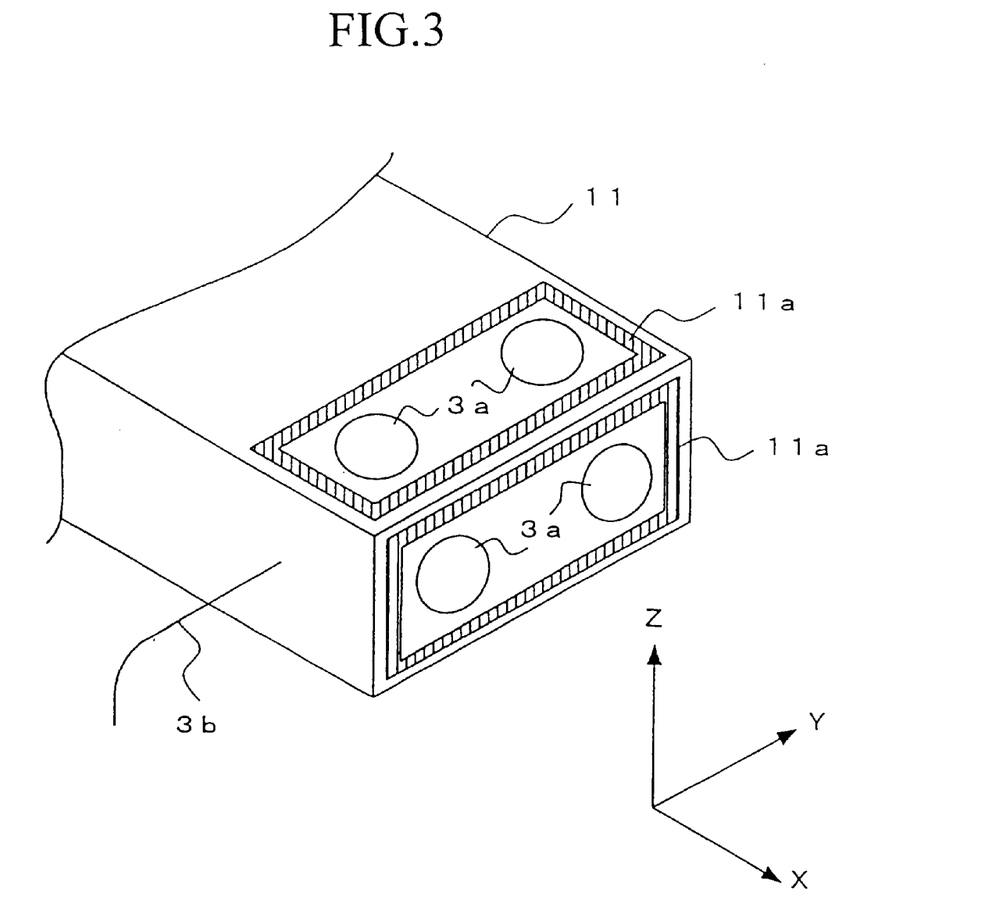
FIG. 3 is a perspective view showing another example of a movable part according to an embodiment of the present invention.

In this stage apparatus, since the air exhaust ports 4a and the air exhaust grooves 3c are configured to always face each other over the movement range of the movable part 3, the air blown out of the bearing pads 3a can be properly exhausted without leaking the air into ambience, even when the stage 2 moves, Next, referring to FIG. 3, another example of the movable part 3 of a static air-bearing of a stage apparatus according to an embodiment of the present invention will be explained.

A movable part 11 shown in FIG. 3 has rectangle-shaped air exhaust grooves 11a which have sides parallel to the Y-axis, instead of the air exhaust grooves 3c formed on the movable part shown in FIG. 2. Since these air exhaust grooves 11a of the movable part 11 allow longer range parallel to the Y-axis compared with the aforementioned air exhaust grooves 3c of the movable part 3, these air exhaust grooves 11a can face the air exhaust parts 4a of the fixed part 4 over longer range. Thus, a larger moving stroke can be attained without changing the length in the Y direction of the movable part 3.

Further, referring to FIG. 4, yet another example of the movable pad 3 of a static air-bearing of a stage apparatus according to an embodiment of the present invention will be explained.

Figure 4:
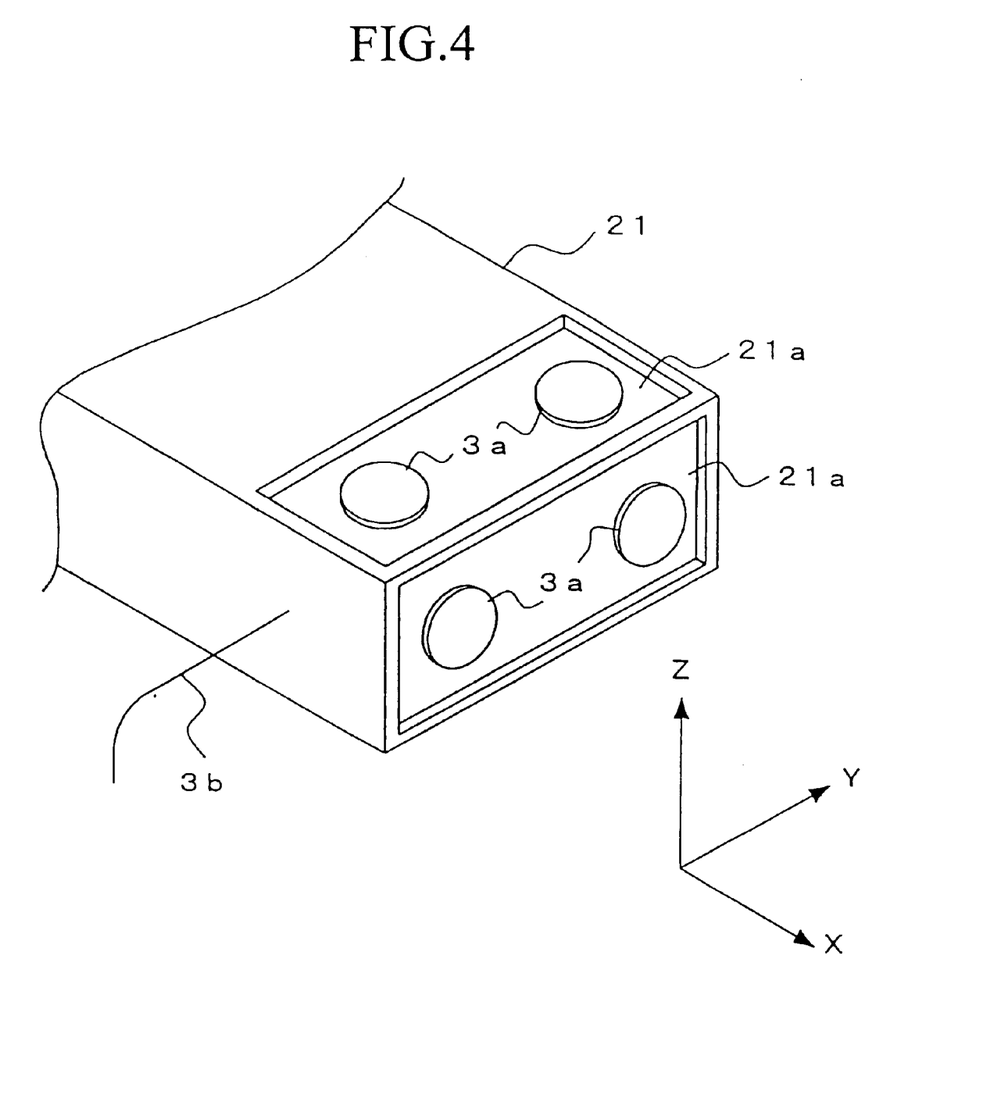
FIG. 4 is a perspective view showing yet another example of a movable part according to an embodiment of the present invention.

A movable part 21 shown in FIG. 4 has air exhaust grooves 21a which are hollow-shaped and formed extensively around the two bearing pads 3a, instead of the air exhaust grooves 3c formed on the movable part shown in FIG. 2. Since this movable part 21 makes air flow passage length between the air exhaust grooves 21a and the air exhaust ports 4a shorter, the air exhaust ports 4a can effectively exhaust the air in the air exhaust grooves 21a. In addition, since the opening area of the air exhaust ports 4a facing the air exhaust grooves 21a can be made larger, the air exhaust efficiency can be further improved.

Figure 5:
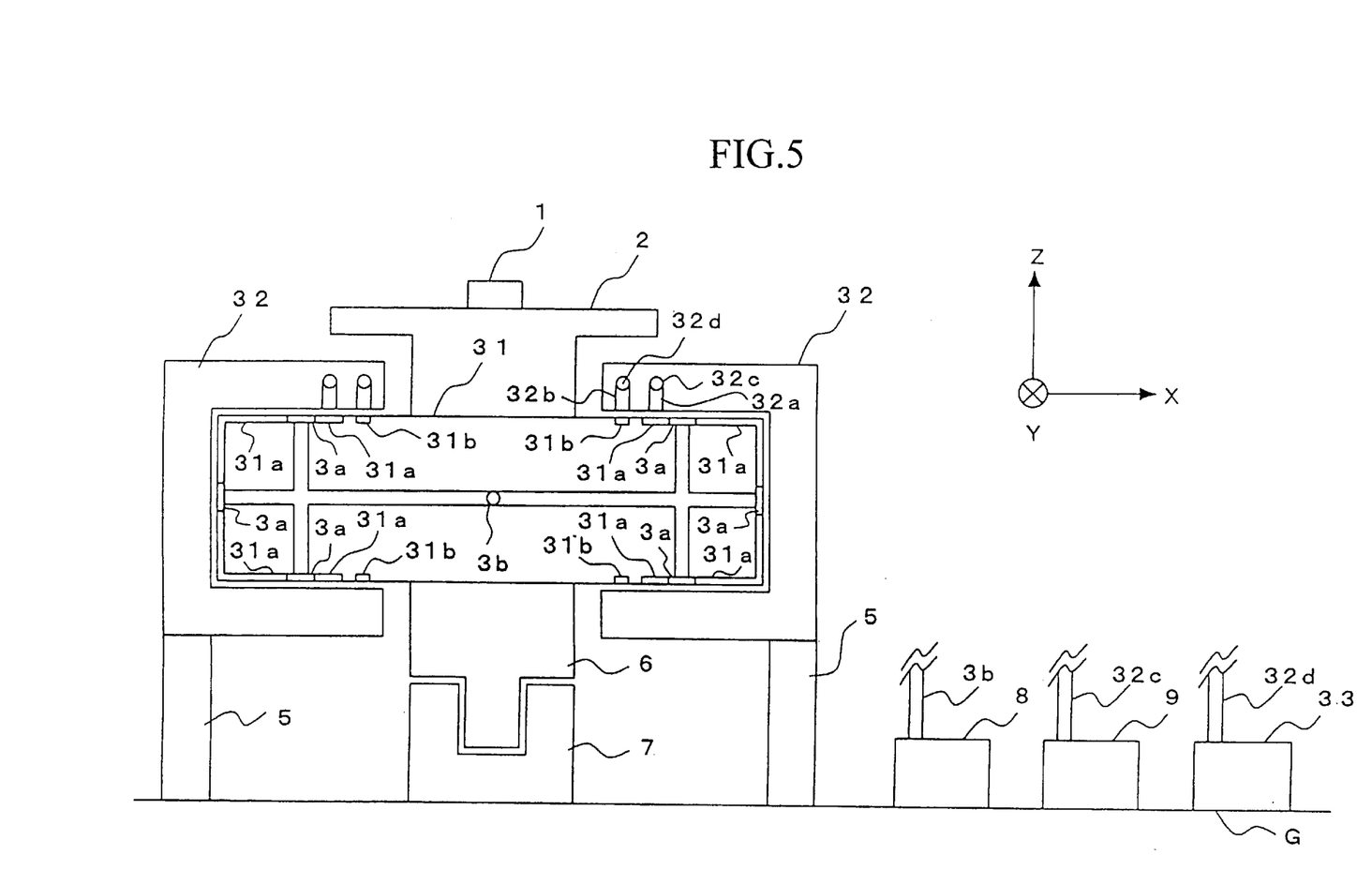
FIG. 5 is a view generally showing another example of a stage apparatus according to an embodiment of the present invention.
Figure 6:
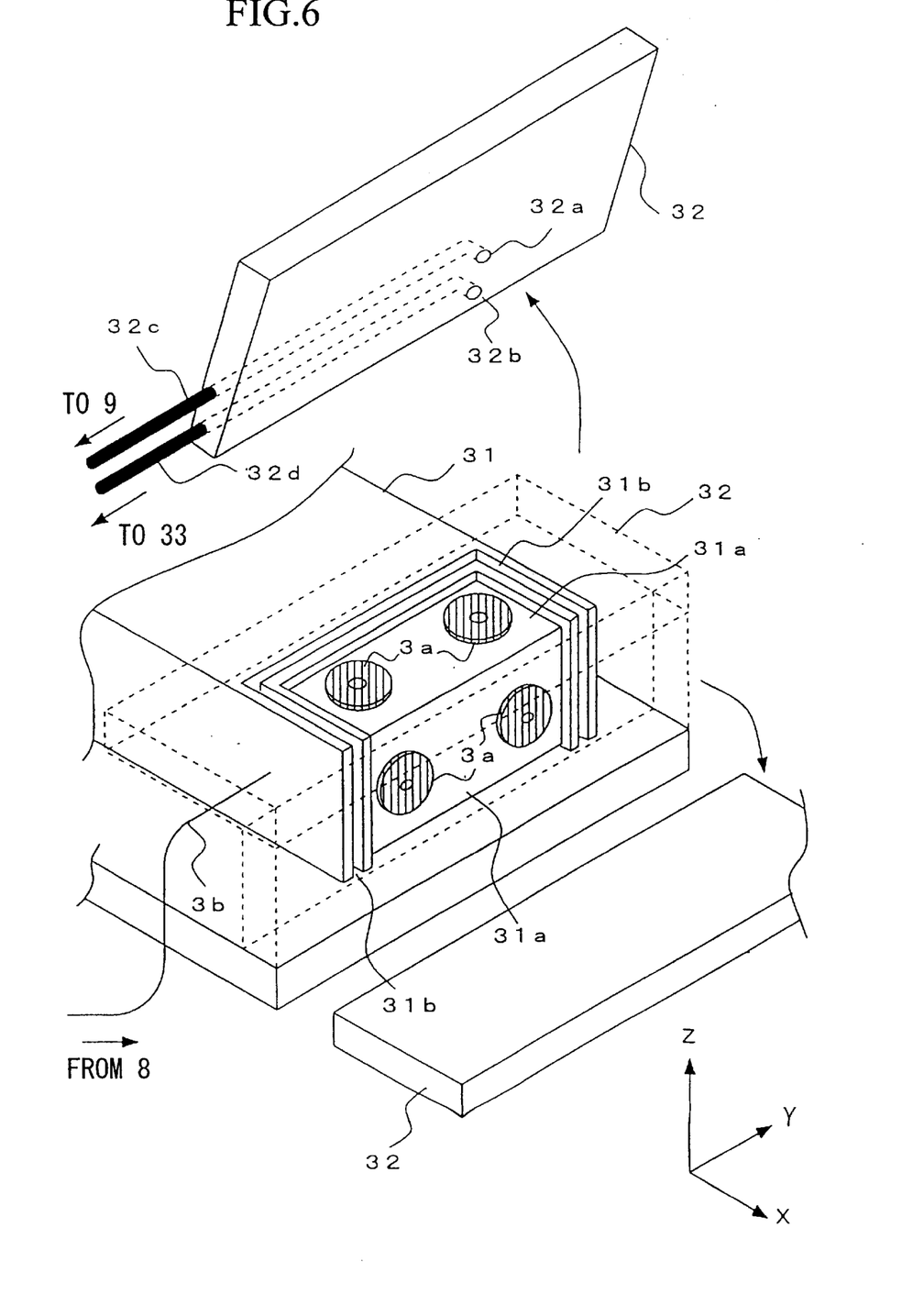
FIG. 6 is a perspective view partially showing another example of a stage apparatus according to an embodiment of the present invention.

Next, referring to FIGS. 5 and 6, another example of a static air-bearing of a stage apparatus according to an embodiment of the present invention will be explained. FIG. 5 generally shows a structure of another example of a stage apparatus. FIG. 6 is a perspective view showing +X side end portions of the another example of a static air-bearing of a stage apparatus, more specifically, showing a state in which the fixed part 4, facing the +X and +Z side surfaces of the movable part 31, is exploded. Further, in FIGS. 5 and 6, the elements that have similar function as those shown in FIG. 1 are denoted by the same numerals and overlapping descriptions are omitted.

At the +X side end portions of the movable part 31, hollow-shaped air exhaust groove 31a is formed over the three +X, +Z, and −Z side surfaces facing the fixed part 4 and formed extensively around the six bearing pads 3a formed on the three surfaces; further, another air exhaust groove 31b is formed so as to surround the air exhaust groove 31a. Furthermore, like air exhaust grooves 31a and 31b are formed also at the −X side end portions of the movable part 31.

As shown in FIG. 6, on a surface of the fixed part 32 facing the movable part 31, an air exhaust port 32a is formed at a position always facing, over the movement range of the movable part 31, the air exhaust groove 31a; and, an air exhaust port 32b is formed at a position always facing, over the movement range of the movable part 31, the air exhaust groove 31b.

The air exhaust port 32a is connected to a rotary pump 9 via a pipe 32c and the air exhaust port 32b is connected to a turbo pump 33 which suck in air more strongly.

In this static air-bearing, air is supplied via the tube 3b to the bearing pads 3a of the movable part 31 by the air supply source 8, and said air is blown into the space between the fixed part 32 and the movable part 31. The blown up air passes through the space between the fixed part 32 and the movable part 31, is temporarily stored in the air exhaust groove 31a formed so as to surround the bearing pads 3a, and the stored air is exhausted at the air exhaust port 32a facing the air exhaust groove 31a by the rotary pump 9 via the exhaust pipe 32c. Further, air leaking from the air exhaust groove 31a is stored in the air exhaust groove 31b formed so as to surround the air exhaust groove 31a, and said stored air is exhausted at the air exhaust port 32c facing the air exhaust groove 31b by the turbo pump 33 via the exhaust pipe 32d. By this, an air layer of approximately constant pressure is formed between the movable part 31 and the fixed part 32, and the movable part 31 and the fixed part 32 are kept apart at a predetermined clearance.

In addition, since the blown up air from the bearing pads 3a is stored by the twofold air exhaust grooves 31a and 31b and is exhausted from the air exhaust grooves 31a and 31b by the rotary pump 9 and the turbo pump 33, air leakage into ambience can be prevented more effectively. Accordingly, this stage apparatus can be used in such environment that a high vacuum is to be maintained or a special gas atmosphere is to be maintained.

Alternatively, although, in these embodiments, the air exhaust grooves are formed so as to surround the bearing pads 3a, in case where a little air leakage outside of the static air-bearing from the bearing pads 3a is permissible, the air exhaust grooves need not be formed so as to surround the bearing pads. Also alternatively; although, in these embodiments, examples in which movable parts and fixed parts face each other's flat surfaces have been described, the movable parts and the fixed parts may face each other's curved surfaces. Also, although, in these embodiments, examples of static air-bearings in which movable parts move linearly have been described, static air-bearings whose movable parts move rotationally may be implemented.

Figure 7:
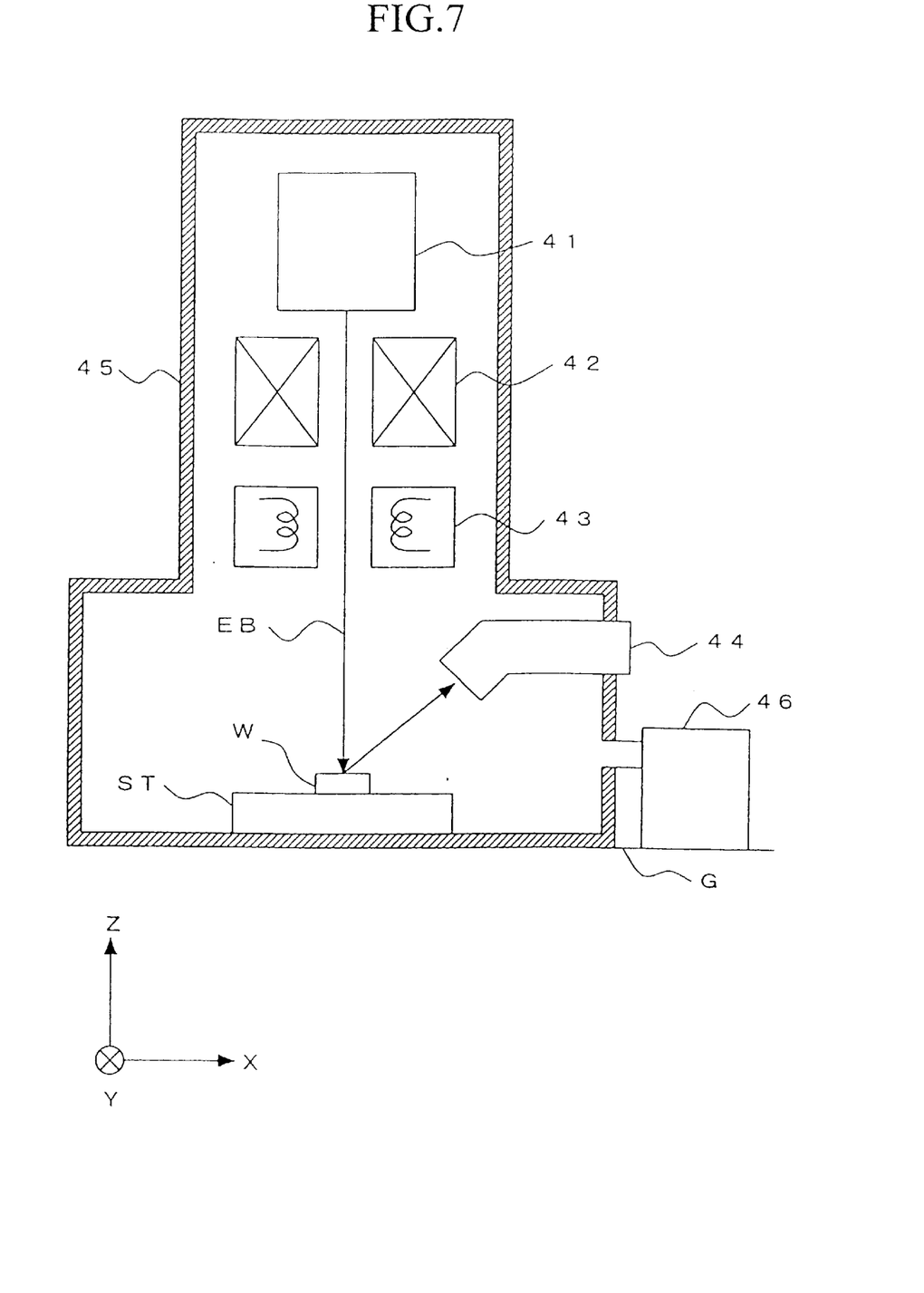
FIG. 7 is a structural view generally showing an inspection apparatus according to an embodiment of the present invention.

Next, referring to FIG. 7, an inspection apparatus as an optical apparatus using a stage apparatus according to an embodiment of the present invention will be explained. FIG. 7 shows a general structure of the inspection apparatus. The inspection apparatus according to an embodiment of the present invention is an inspection apparatus to inspect whether the circuitry pattern to be projected has been formed on a wafer in accordance with a circuitry design. In FIG. 7, an X-axis and a Y-axis, perpendicular to each other, are set in a plane parallel to a installation floor G; and, a Z-axis is set perpendicular to the installation floor G.

The inspection apparatus has an electron gun 41 which irradiates an electron beam EB. The electron beam EB irradiated from the electron gun 41 is converged by an electron lens 42 and then scanned by a deflection coil 43 and impinged onto a wafer W.

The wafer W is mounted on a XY stage ST formed from a stage apparatus according to an embodiment of the present invention and is configured to move in the X-direction and the Y-direction.

Secondary electrons produced by the impingement of the electron beam EB onto the wafer W or the electrons of the electron beam EB reflected by a reticle R are detected by a detection system 44. The detection system 44 detects a pattern on the wafer W based on the detected secondary or reflected electrons, and inspects whether said detected pattern complies with a designed pattern comparing said detected pattern with the designed pattern.

The above-mentioned electron gun 41, electron lens 42, deflection coil 43, wafer W, and XY stage ST are placed in a chamber 45. The chamber 45 is connected to a vacuum pump 46 and the inside of the chamber 45 is configured to maintain vacuum.

In this inspection apparatus, while the inside of the chamber 45 being maintained at a vacuum state by the vacuum pump 46, the electron beam EB is irradiated by the electron gun 41, and the irradiated electron beam EB is converged by the electron lens 42, scanned by the deflection coil 43 and impinged onto the wafer W on the XY stage ST. During such operation, the XY stage ST moves the wafer W so that the electron beam EB impinges onto the whole surface of the wafer W.

Further, In conjunction with the above operation, the detection system 44 detects the secondary or reflected electrons from the wafer W and detects a pattern formed on the wafer W based on the detected electrons, and inspects whether the detected pattern complies with the designed pattern by comparing the detected pattern with the designed pattern.

Since, as described above, this inspection apparatus uses a stage apparatus in accordance with an embodiment of the present invention as the XY stage ST, the pipe arrangement can be easily realized and the size of the XY stage ST can be made small as well. Also, the size of the inspection apparatus can be made small, because the size of the XY stage ST can be made small. Further, since the static air-bearing used in the XY stage ST does not leak air into ambience, such an adverse effect that deteriorates the vacuum degree in the chamber 45 can be avoided.

Figure 8:
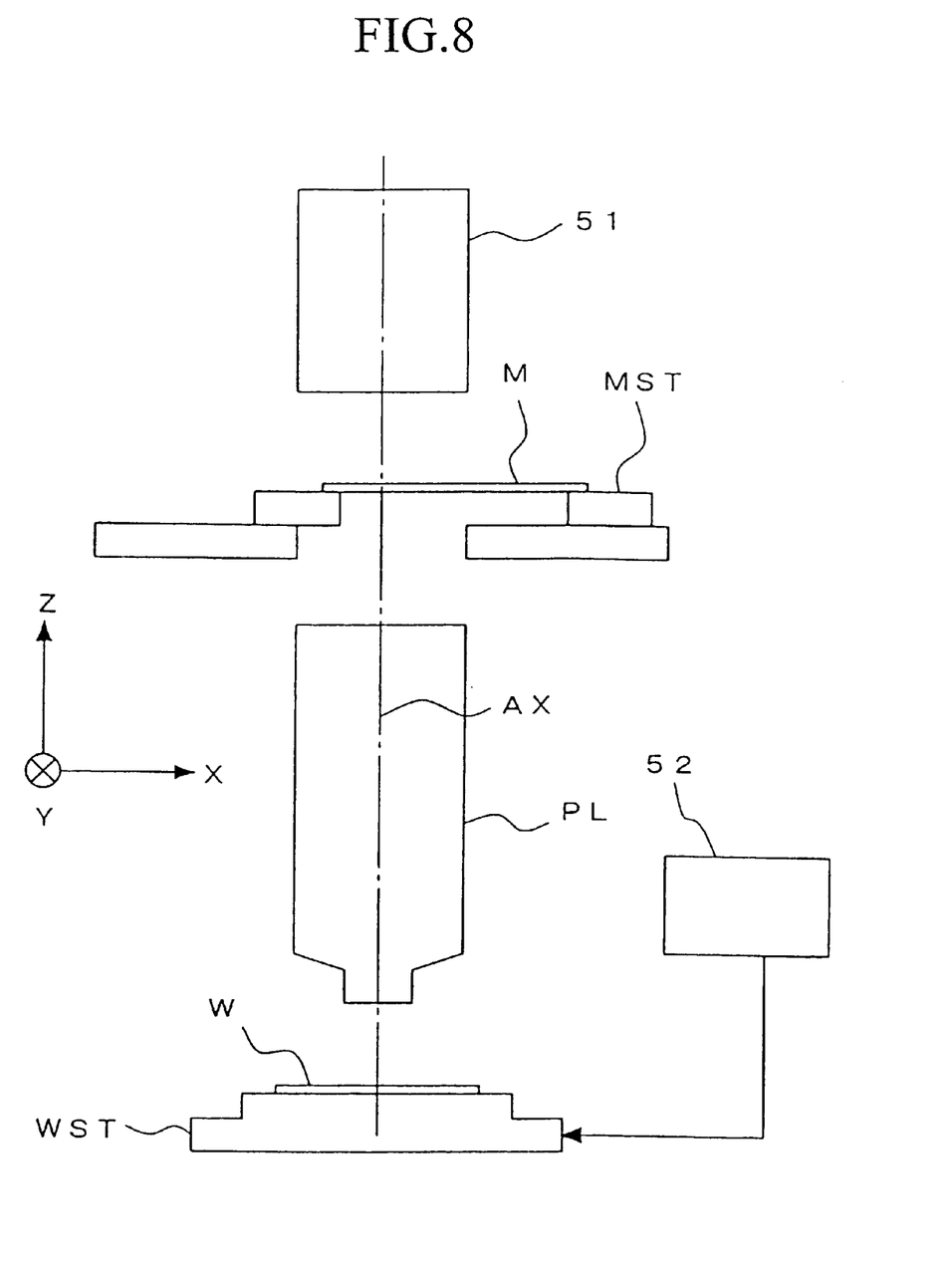
FIG. 8 is a structural view generally showing an exposure apparatus according to an embodiment of the present invention.

Next, referring to FIG. 8, an exposure apparatus as another example of an optical apparatus using a stage apparatus according to an embodiment of the present invention will be explained. FIG. 8 shows a general structure of the exposure apparatus in accordance with an embodiment of the present invention. In this embodiment, a description will de done using, as an example, a projection exposure apparatus that adopts step-and-repeat mode exposure operation. In FIG. 8, a Z-axis is set parallel to an axis AX of a optical projection system PL; and, an X-axis and a Y-axis, perpendicular to each other, are set in a plane perpendicular to the Z-axis.

An illumination system 51 is configured so that light from such a light source as a mercury lamp, a KrF excimer maser, or an ArF excimer laser is uniformly illuminated onto a reticle R mounted on a reticle stage RST via a fly-eye lens and a condenser lens, etc.

A pattern formed on the reticle R is imaged onto a wafer W through the optical projection system PL, being reduced by a factor of 4. The wafer W is held on a wafer stage WST by a holding mechanism (not shown). The wafer stage WST comprises an X stage that moves in the X direction and a Y stage that moves in the Y direction.

The X and Y stages are each formed from a stage apparatus according to an embodiment of the present invention. The wafer stage WST is configured to move in the X-direction and the Y-direction under the control of a control system 52.

In this projection exposure embodiment, an alignment system (not shown) detects the positional relationship between the reticle R and the wafer W based on an alignment mark formed on the reticle R and an alignment mark formed on the wafer W; and the pattern on the reticle R and a predetermined shot area on the wafer W are aligned by moving the wafer by the wafer stage WST.

The reticle R is then illuminated by the illumination light from the illumination system 51, and the pattern on the reticle R is projected and transferred onto resist on the surface of the wafer W. Next, in a similar manner as described above, the image of the pattern on the reticle R is successively transferred onto other shot areas on the wafer W.

Thus, since this exposure apparatus uses a stage apparatus in accordance with an embodiment of the present invention as the wafer stage WST, the pipe arrangement can be easily realized and the size of the wafer stage WST can be made small as well. Also, the size of the exposure apparatus can be made small, because the size of the wafer stage WST can be made small. Further, like the case where the deterioration of the degree of vacuum can be avoided when the static air-bearing in accordance with the present invention is used in a vacuum shown in FIG. 7, if the static air-bearing in accordance with the present invention is used in a high cleanliness level atmosphere or in a special gas atmosphere of a projection exposure apparatus, etc., an adverse effect on the surrounding atmosphere by the air supplied to the static air-bearing can be avoided.

Next, referring to FIG. 9, an electron beam exposure apparatus as yet another example of an optical apparatus using a stage apparatus according to an embodiment of the present invention will be explained.

Figure 9:
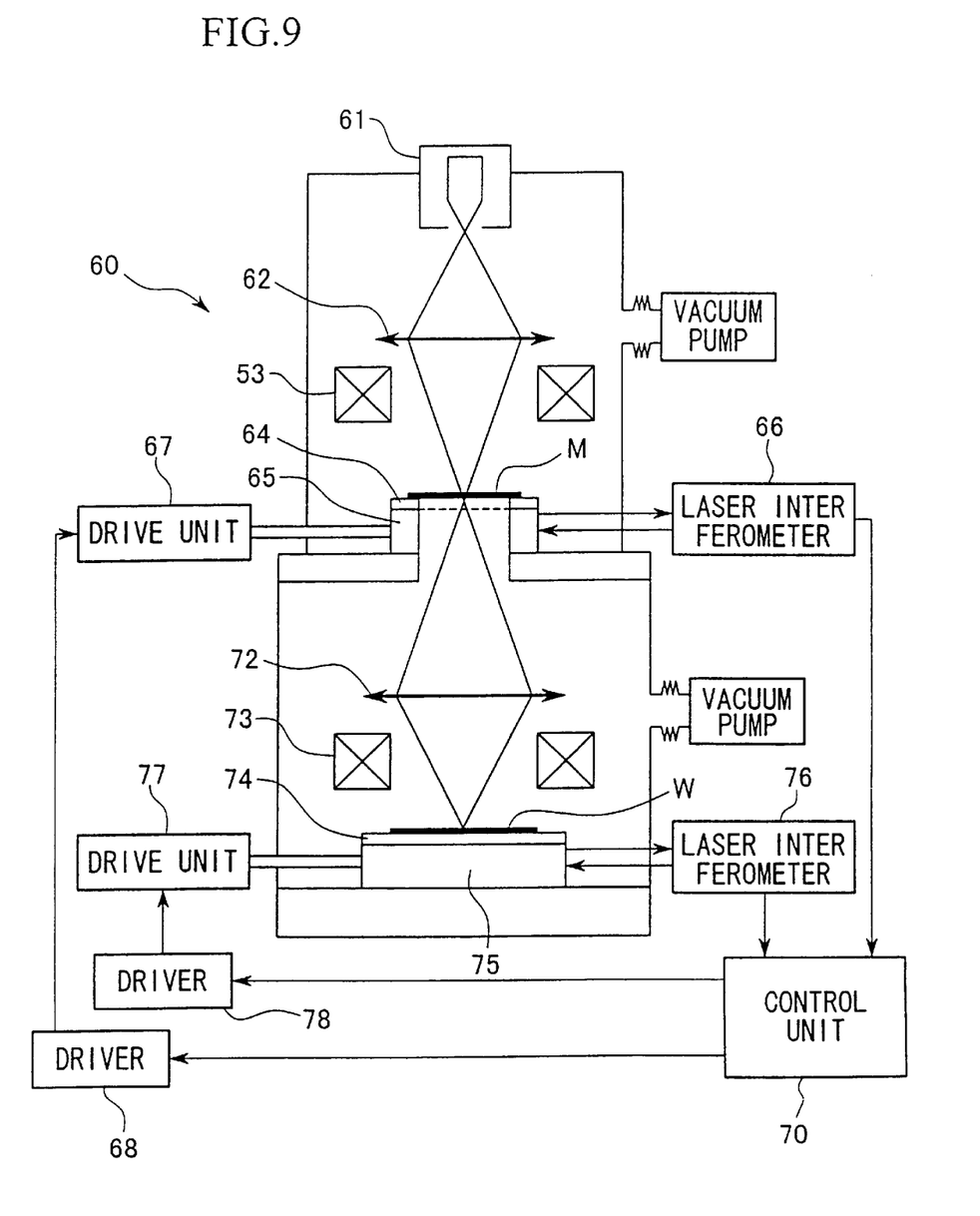
FIG. 9 is a structural view showing an electron beam exposure apparatus according to an embodiment of the present invention.

FIG. 9 schematically shows a structure of the electron beam exposure apparatus in accordance with an embodiment of the present invention. The electron beam exposure apparatus 60 has an electron gun 61 as a charged particle ray source. An electron beam 62 emitted downward from the electron gun 61 is converged by a condenser lens 63 and focused on a mask M. The mask M is held on a chuck 64 mounted on a stage 65. The stage 65 is configured so as to be accurately run and positioned in the XY-plane (horizontally) by a drive unit 67. The drive unit 67 is controlled and driven by instructions transmitted from a control unit 70 to a driver 68 based on precise positional data of the stage 65 measured by a laser interferometer 66.

An electron beam 72 passed through the mask M further proceeds downward being expanded and then converged, deflected, and focused onto the surface of a wafer W by a second condenser lens 73. The wafer W is head on a chuck 74 mounted on a stage 75. The stage 75 is configured so as to be accurately run and positioned in the XY-plane (horizontally) by a drive unit 77. The drive unit 77 is controlled and driven by instructions transmitted from a control unit 70 to a driver 78 based on precise positional data of the stage 75 measured by a laser interferometer 76.

The stage 65 is, in accordance with the structural configuration of a static air-bearing of an embodiment of the present invention, held out of contact with the main body of the exposure apparatus and is pushed, based on the positional coordinates from the interferometer 66 that measures the position of the stage 65, by a drive shaft protruding from the drive unit 67. Incidentally, as the drive unit 67, for example, a linear motor is used.

The stage 75 is, being configured like the stage 65, held out of contact with the main body of the exposure apparatus and is pushed, based on the positional coordinates from the interferometer 76 that measures the position of the stage 75, by a drive shaft protruding from the drive unit 77. Incidentally, as the drive unit 77, for example, a linear motor is used.

Each position of the stage 65 and 75 is measured by the interferometer 66 and 76 respectively, the driving instructions are transmitted from the control unit 70 to the drivers 68 and 78 of the respective drive units 67 and 77 corresponding to the respective stages 65 and 75 based on the measured positional coordinates, and then each position of the stage 65 and 75 is controlled.

Further, although piping required for air and vacuum systems is not specifically illustrated in the Figure, the piping can be either additionally placed or disposed within the drive shaft shown in the Figure so as to be led to outside of the chamber.

In addition, although the drive shaft connecting the stage 65 and the drive unit 67 is illustrated as being disposed through the boundary between the high vacuum side and the outside of the high vacuum side in the Figure, a low vacuum chamber to contain the drive unit 67 within it can be placed adjacent to the high vacuum chamber. Alternatively, the drive units 67 and 77 can be placed near the stages 65 and 75 respectively so as to be hermetically sealed in the high vacuum chamber, and can directly drive the stages 65 and 75 without the drive shafts.

As for the chucks 64 and 74, they can be designed to either electrostatically or mechanically hold the mask or wafer respectively.

Although exposure apparatuses and an inspection apparatus have been described in the above embodiments, the present invention is not restricted to those apparatuses but can also be applied to, for example, an electron microscope or an electron beam apparatus.

Although a wafer has been described as a specimen to be processed in the above embodiments, the present invention is not restricted to the wafer but can also be applied to apparatuses that process glass substrates such as a mask or a liquid crystal substrate.

It should be noted that the exposure or inspection apparatuses in accordance with the present invention can be manufactured by incorporating an illumination system and a projection optical system each comprising a plurality of lenses into the body of the optical apparatus followed by optical adjustments to them, by incorporating a reticle stage and a wafer stage each comprising a number of mechanical components into the body of the optical apparatus followed by wiring and piping, and further by making overall adjustments (electrical adjustments, operation confirmation, etc.). The manufacturing of these apparatuses should preferably be done in a clean room where temperature, a cleanliness level, etc. are controlled.

It should also be noted that semiconductor devices are manufactured by the process comprising a step for designing their functions and performance, a step for manufacturing a reticle in accordance with the design step, a step for producing a wafer from a silicon material, a step for exposing the wafer with a pattern on the reticle by the use of an above-mentioned exposure apparatus embodiment, a step for inspecting wafer chips by the use of another above-mentioned inspection apparatus embodiment, steps for assembling devices (including a dicing process, a bonding process, a packaging process), a step for testing, etc.

As described above, the present invention can provide a static air-bearing, a stage apparatus, and an optical apparatus each of which can limit its size and can make pipe arrangement easily.

What is claimed is:

1. A static air-bearing comprising a fixed part and a movable part movably disposed along said fixed part and maintaining a predetermined clearance between said fixed part and said movable part by an air layer between said fixed part and said movable part, wherein said movable part has an air blow portion that blows air into said air layer between said fixed part and said movable part and an air exhaust groove that exhausts said air blown out of the air blow portion, and in that said fixed part has an air exhaust port that is disposed at a position facing said air exhaust groove.

2. A static air-bearing as claimed in claim 1, wherein said air exhaust groove is disposed so as to surround said air blow portion.

3. A static air-bearing as claimed in claim 1, wherein said air exhaust port is disposed, with respect to movement direction of said movable part, approximately on the center of the surface of said fixed part corresponding to a moving area of said movable part.

4. A static air-bearing as claimed in claim 1, wherein said air exhaust groove provided on said movable part includes a first air exhaust groove and a second air exhaust groove, said movable part providing said second air exhaust groove around said first air exhaust groove, and in that said fixed part has a first air exhaust port that is disposed at a position facing, over the moving area of said movable part, said first air exhaust groove to suck and exhaust the air in said first air exhaust groove and has a second air exhaust port that is disposed at a position facing, over the moving area of said movable part, said second air exhaust groove to suck and exhaust the air in said second air exhaust groove.

5. A static air-bearing as claimed in claim 1, wherein said movable part and said fixed part face each other at a plurality of surfaces, and in that said air exhaust groove is disposed so as to extend over a plurality of surfaces.

6. A stage apparatus comprising a static air-bearing provided with a movable part movably disposed along a fixed part, a stage fixed to said movable part, and a stage drive unit that moves said stage, wherein said static air-bearing is the static air-bearing as claimed in claim 1.

7. An optical apparatus comprising a stage apparatus that mounts a specimen to be processed thereon and an irradiation system that irradiates a light beam or a charged particle beam onto said specimen mounted on said stage apparatus, wherein said stage apparatus is the stage apparatus as claimed in claim 6.

8. A static pressure air-bearing comprising:
a fixed part;
a movable part facing said fixed part and which is movably disposed along a predetermined direction; and
an air layer provided between said fixed part and said movable part and maintaining a predetermined clearance between said fixed part and said movable part;
wherein said movable part has a blow portion that blows air into said air layer between said fixed part and said movable part, and in said fixed part, an air is exhaust port is disposed at a position facing said movable part and exhausts said air in said air layer.

9. A static pressure air-bearing according to claim 8, wherein said movable part has an air exhaust groove that is disposed at a position facing said air exhaust port on a surface which faces said fixed part so as to extend along said predetermined direction and which recovers said air in said air layer.

10. A static pressure air-bearing according to claim 9, wherein said exhaust groove is disposed so as to surround said air layer between said fixed part and said movable part.

11. A static pressure air-bearing according to claim 9, wherein said movable part and said fixed part face each other at a plurality of surfaces, and said air exhaust groove is disposed so as to extend over said plurality of surfaces.

12. A static pressure air-bearing comprising:
a fixed part;
a movable part movablyt disposed so as to face said fixed part;
an air layer provided between said fixed part and said movable part and maintaining a predetermined clearance between said fixed part and said movable part;
a blow portion disposed at said movable part so as to face said fixed part and which blows air into said air layer; and
an air exhaust port disposed at said fixed part so as to face said movable part and which exhausts said air in said air layer.

13. A static pressure air-bearing according to claim 12, whereins aid movable part has an air exhaust groove that is disposed so as to surround said blow portion and which exhausts said air from said air layer to said air exhaust port.

14. A stage apparatus comprising:
a fixed part;
a movable part movably disposed so as to face said fixed part;
an air layer provided between said fixed part and said movable part and maintaining a predetermined clearance between said fixed part and said movable part;
a blow portion disposed at said movable part so as to face said fixed part and which blows air into said air layer;
an air exhaust port disposed at said fixed part so as to face said movable part and which exhausts said air in said air layer;
a stage fixed to said movable part and which mounts an object; and
a stage drive unit that moves said stage;

15. A stage apparatus according to claim 14, wherein said stage drive unit is a linear motor, and said stage drive unit and said layer are disposed at different positions.

16. A stage apparatus according toc laim 14, wherein said movable part has an air exhaust groove that is disposed so as to surround said blow portion and which exhausts said air from said air layer to said air exhaust port.

17. A stage apparatus according to claim 14, wherein said stage drive unit and said object are disposed in different spaces.

18. A stage apparatus according to claim 14, wherein said movable part separates said stage drive unit and said object so as to be disposed in different spaces.

19. A method for blowing and exhausting air to a static prssure air-bearing having an air layer provided between a fixed part and a movable part, comprising the steps of:
blowing said air into said air layer from a surface of said movable part which faces said fixed fixed part;
recovering said air in said air layer from an air exhaust groove which is disposed at said movable part; and
exhausting said recovered air from an air exhaust port which is disposed at said fixed part so as to face said air exhaust groove.

* * * * *